United States Patent
Yoo et al.

(10) Patent No.: US 7,601,553 B2
(45) Date of Patent: Oct. 13, 2009

(54) METHOD OF MANUFACTURING A GALLIUM NITRIDE SEMICONDUCTOR LIGHT EMITTING DEVICE

(75) Inventors: Tae-Kyung Yoo, Yongin-si (KR); Joong-Seo Park, Yongin-si (KR); Chang-Tae Kim, Seongnam-si (KR)

(73) Assignee: EpiValley Co., Ltd., Gyeonggi (KR)

( * ) Notice: Subject to any disclaimer, the term of this patent is extended or adjusted under 35 U.S.C. 154(b) by 344 days.

(21) Appl. No.: 10/563,269

(22) PCT Filed: Jul. 16, 2004

(86) PCT No.: PCT/KR2004/001770

§ 371 (c)(1), (2), (4) Date: Jan. 4, 2006

(87) PCT Pub. No.: WO2005/008795

PCT Pub. Date: Jan. 27, 2005

(65) Prior Publication Data

US 2006/0157714 A1 Jul. 20, 2006

(30) Foreign Application Priority Data

Jul. 18, 2003 (KR) .................. 10-2003-0049501
Oct. 10, 2003 (KR) .................. 10-2003-0070759

(51) Int. Cl.
*H01L 21/00* (2006.01)

(52) U.S. Cl. .................. 438/47; 257/E33.028

(58) Field of Classification Search .......... 257/E33.028; 438/47
See application file for complete search history.

(56) References Cited

U.S. PATENT DOCUMENTS

| 5,247,533 | A | 9/1993 | Okazaki et al. |
|---|---|---|---|
| 5,306,662 | A | 4/1994 | Nakamura et al. |
| 5,650,198 | A | 7/1997 | Denbaars et al. |
| 5,926,726 | A | 7/1999 | Bour et al. |
| 6,043,140 | A | 3/2000 | Kawai et al. |
| 6,479,313 | B1 * | 11/2002 | Ye et al. ............. 438/47 |
| 6,508,879 | B1 * | 1/2003 | Hashimoto ........... 117/104 |
| 6,515,306 | B2 * | 2/2003 | Kuo et al. ............ 257/82 |
| 2003/0122147 | A1 * | 7/2003 | Sheu ................. 257/103 |

FOREIGN PATENT DOCUMENTS

| EP | 1061083 | 4/2003 |
|---|---|---|
| JP | 8-56015 A | 2/1996 |
| JP | 10-17400 | 1/1998 |

* cited by examiner

*Primary Examiner*—Howard Weiss
(74) *Attorney, Agent, or Firm*—Husch Blackwell Sanders LLP

(57) ABSTRACT

The present invention relates to a nitride semiconductor light emitting device including a plurality of nitride semi-conductor layers with a p-type nitride semiconductor formed using as nitrogen precursor ammonia together with hydrazine-based material which upon thermal decomposition generates a radical being combined with a hydrogen radical to eliminate the hydrogen radical, thereby eliminates the need for a subsequent annealing process for removing hydrogen and prevents the active layer from being thermally damaged due to the subsequent annealing process.

7 Claims, 3 Drawing Sheets

US 7,601,553 B2

METHOD OF MANUFACTURING A GALLIUM NITRIDE SEMICONDUCTOR LIGHT EMITTING DEVICE

TECHNICAL FIELD

The present invention relates to a nitride semiconductor light emitting device, and more particularly, to a nitride semiconductor light emitting device which eliminates the need for a subsequent annealing process for removing hydrogen that undesirably exists in a p-type nitride semiconductor layer.

BACKGROUND ART

In a nitride semiconductor light emitting device, hydrogen is undesirably included in a p-type nitride semiconductor layer upon the growth of the p-type nitride semiconductor layer. At this time, the p-type nitride semiconductor layer has the properties of an insulator, but not the properties of a semiconductor due to hydrogen. It is thus required that an additional activation annealing process for removing hydrogen be performed after the p-type nitride semiconductor layer has been grown.

U.S. Pat. No. 5,306,662 discloses a method for eliminating hydrogen through annealing at a temperature of 400° C. or more after a p-type nitride semiconductor layer is grown. U.S. Pat. No. 5,247,533 discloses a method for forming a p-type nitride semiconductor layer by irradiation of a n electron beam.

Therefore, such a conventional process is complicated as well as an underlying active layer can be thermally damaged due to the annealing process, which results in a high possibility of degrading the performance of the device.

Meanwhile, U.S. Pat. No. 6,043,140 proposes a method for fundamentally prohibiting the introduction of hydrogen upon the growth of p-type GaN using a nitrogen precursor and a nitrogen carrier from which hydrogen is not generated. It is, however, not easy to obtain satisfactory surface morphology that can be applied to a light emitting device through this method.

FIG. 1 is a cross-sectional view illustrating the structure of a conventional nitride semiconductor light emitting device. A method for fabricating the conventional nitride semiconductor light emitting device will be hereinafter described in brief. Referring to FIG. 1, the nitride semiconductor light emitting device includes a buffer layer 11, a lower contact layer 12 composed of a n-type nitride semiconductor, an active layer 13 composed of a nitride semiconductor, and an upper semiconductor layer 14 composed of a p-type nitride semiconductor, all of which are sequentially grown on an insulating substrate 10.

Thereafter, an activation annealing process is performed in which hydrogen contained in the upper contact layer 14 is removed at a high temperature of 400° C. or more. A transparent electrode layer 15 is then formed on the upper contact layer 14 that is brought into ohmic-contact with the transparent electrode layer 15. The upper contact layer 14 and the active layer 13 are mesa-etched to expose the lower contact layer 12. An n-type ohmic metal electrode layer 16 is formed on the lower contact layer 12 and a bonding pad 17 is then formed on the transparent electrode layer 15. Finally, a protection film 18 is formed.

The bonding pad 17 is usually formed on the transparent electrode layer 15, but may be directly formed on the upper contact layer 14 after some of the transparent electrode layer 15 is eliminated. An n-type nitride semiconductor layer of a high concentration or a superlattice layer made of the nitride semiconductor can be interposed between the upper contact layer 14 and the transparent electrode layer 15 to form a tunnel junction therebetween. The insulating substrate 10 is formed using sapphire, SiC, GaN, AlN or the like.

In order to fabricate such a LED, growth of single crystal is needed. A metal organic chemical vapor deposition (MOCVD) method is usually used. In this case, ammonia ($NH_3$) is used as a supply source of nitrogen (N) for growing GaN. In order to grow GaN, $H_2$ is usually used as a carrier gas. In order to grow InGaN, $N_2$ is usually used as a carrier gas. Ammonia ($NH_3$) is thermally stabilized and only several % of $NH_3$ is decomposed at a temperature of over 1000° C. and contributes to the growth of GaN as a nitrogen (N) supply source. Accordingly, in order to increase efficiency of thermal decomposition, high temperature growth is inevitably needed. Also, very high $NH_3$/Ga ratio is required to obtain GaN having good crystallization property.

Such a quite amount of $NH_3$ generates a large amount of hydrogen as a byproduct. In this case, when p-type GaN is grown, hydrogen is combined with magnesium which acts as a p-type dopant, resulting in a bonding of magnesium (Mg)-hydrogen (H) atomics. Thus, magnesium (Mg) does not produce holes and the p-type GaN does not have the property of a semiconductor.

Therefore, after the p-type GaN is grown, it is subjected to a subsequent annealing process for breaking the magnesium (Mg)-hydrogen (H) atomic bonding at a temperature of 400° C. or more. For this reason, Mg provides holes and the p-type GaN has the property of a semiconductor.

As described above, the conventional nitride semiconductor light emitting device requires irradiation of electron beam or a process for annealing at a high temperature of over 400° C. in order to obtain p-type GaN of a high quality. However, this makes the process complicated and the active layer 13 can be thermally damaged during the annealing process. Resultantly, there is a high possibility of degrading the performance of the device.

DISCLOSURE

Technical Problem

Accordingly, the present invention has been made in view of the above problems, and it is an object of the present invention to provide a nitride semiconductor light emitting device in which hydrogen is prevented from being contained in a p-type nitride semiconductor layer when the semiconductor layer is grown, thereby eliminating the need for an additional subsequent annealing process for removing hydrogen.

Technical Solution

To achieve the above object, according to the present invention, there is provided a nitride semiconductor light emitting device including a plurality of nitride semiconductor layers having an active layer that generates light through recombination of electrons and holes, and an electrode layer disposed on the plurality of the nitride semiconductor layers, the electrode layer being electrically in contact with the plurality of the nitride semiconductor layers, wherein the plurality of the nitride semiconductor layers include a p-type nitride semiconductor layer formed using ammonia and hydrazine-based material as nitrogen precursor.

Herein, the nitride semiconductor refers to $Al_xGa_yIn_{1-x-y}N$ ($0 \leq x \leq 1$, $0 \leq y \leq 1$, $x+y \leq 1$), and the plurality of the nitride semiconductor layers may include a heterogeneous semiconductor layer such as SiC or a heterogeneous material.

It is preferred that a growth temperature of the p-type nitride semiconductor layer is within a range between 700° C. and 1100° C.

Advantageous Effects

According to the present invention, since an additional subsequent annealing process for removing hydrogen is not necessary, a process is simple and the active layer is prevented from being thermally damaged due to the subsequent annealing process.

Moreover, according to the present invention, it is possible to form a p-type nitride semiconductor layer without a subsequent annealing process and to form a p-type nitride semiconductor layer having such a good morphology as used for a light emitting device.

MODE FOR INVENTION

Figure 1:
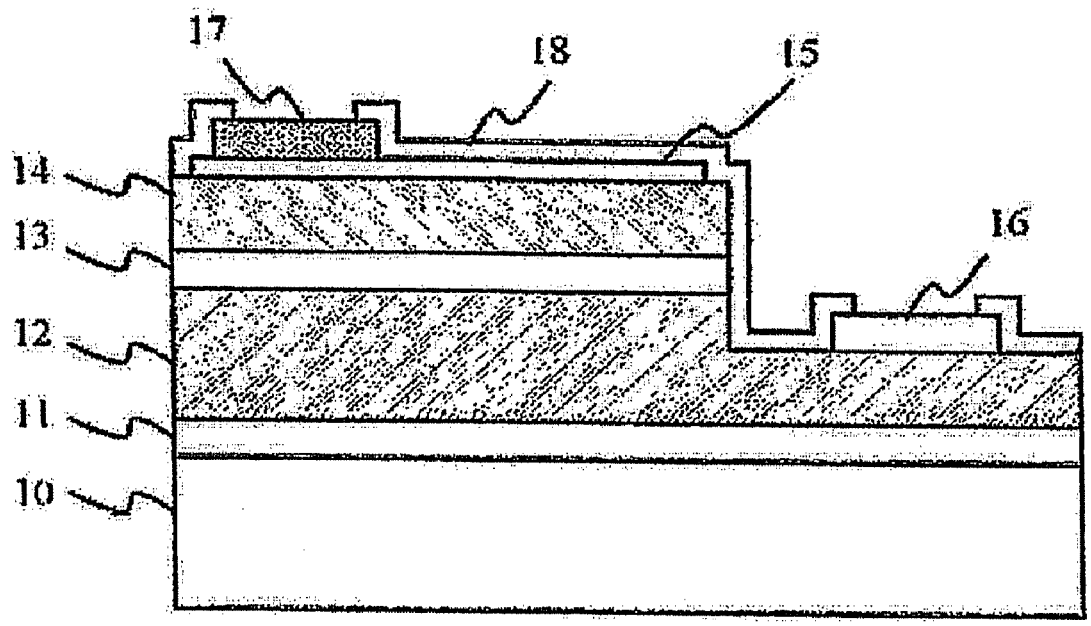
FIG. 1 is a cross-sectional view illustrating the structure of a conventional nitride semiconductor light emitting device.

The present invention will now be described in detail in connection with preferred embodiments with reference to the accompanying drawings. In the drawings, the same reference numerals as those in FIG. 1 refer to components having the same function. Thus, description on them will be omitted in order to avoid redundancy of explanation.

Figure 2:
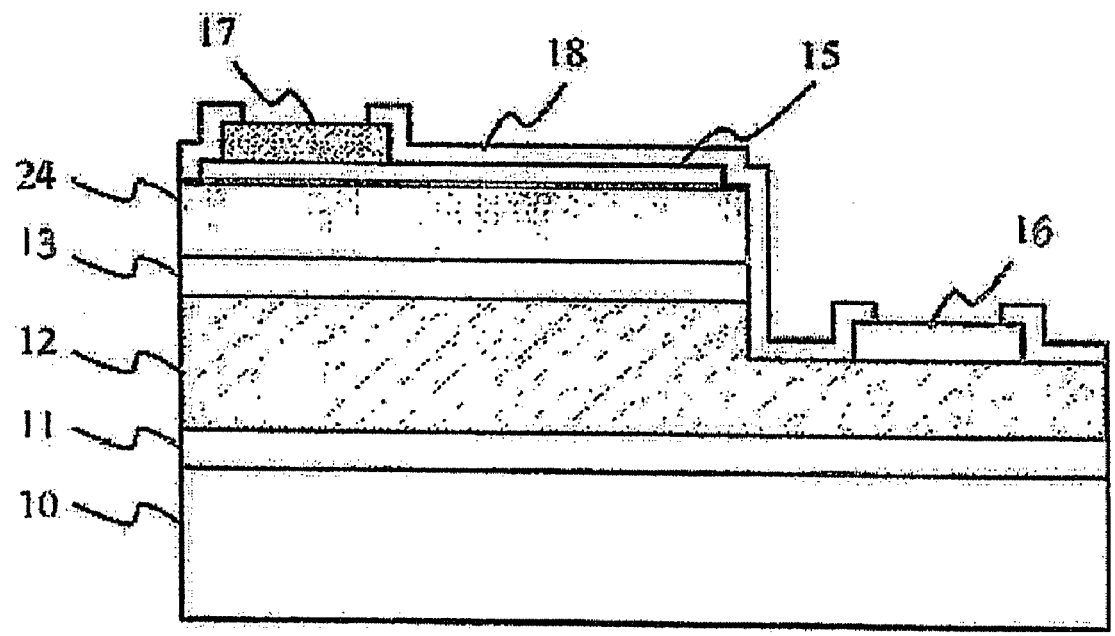
FIG. 2 is a cross-sectional view illustrating a nitride semiconductor light emitting device according to the present invention.

FIG. 2 is a cross-sectional view illustrating a nitride semiconductor light emitting device according to the present invention. A transparent electrode layer 15 can be formed of one selected from the group consisting of nickel, gold, silver, chrome, titanium, platinum, palladium, rhodium, iridium, aluminum, tin, ITO, indium, tantalum, copper, cobalt, iron, ruthenium, zirconium, tungsten, lanthanum and molybdenum, or a combination of two or more thereof.

For example, nickel is deposited to a thickness of 0.5 nm to 100 nm and then gold is deposited to a thickness of 0.5 nm to 1000 nm. Then, they experience an annealing process under an nitrogen, oxygen or mixed gas atmosphere of nitrogen and oxygen at a temperature of 300° C. to 1000° C. for 1 second to 60 minutes. Thus, nickel and gold are brought into ohmic-contact with an upper contact layer 14.

More preferably, after nickel has been deposited to a thickness of 0.5 nm to 10 nm and gold has been deposited to a thickness of 0.5 nm to 10 nm, they undergoes an annealing process under an nitrogen, oxygen or a mixed gas atmosphere of nitrogen and oxygen at a temperature of 400° C. to 700° C. for 1 second to 5 minutes.

A protection film 18 can be formed of, for example, one selected from the group consisting of silicon nitride, silicon oxide, titanium oxide and aluminum oxide, or a combination of two or more thereof. A thickness of each protection film may be 0.1 nm to 10000 nm, preferably 10 nm to 1000 nm.

An upper contact layer 24 is formed without performing an additional subsequent annealing process for removing hydrogen. The process of forming the upper contact layer 24 according to the present invention will now be described in detail.

As a nitrogen precursor, a hydrazine-based material is used together with ammonia. Bond energy between nitrogen radicals of the hydrazine-based material is 33.4 Kcal, which is significantly lower than 93.3 Kcal as bond energy between a nitrogen radical and a hydrogen radical of ammonia.

Therefore, bonding among nitrogen molecules of the hydrazine-based material is easily broken even at a low temperature of 500° C. or more, thereby forming a $NH_2$ radical.

For example, dimethylhydrazine (DM-hydrazine) will be described as s an example below. A $NH_2$ radical that is formed through thermal decomposition of dimethylhydrazine is very unstable and has a good reactivity. Thus, the $NH_2$ radical is prone to become a thermally stable ammonia ($NH_3$) through combination with a nearby H radical as soon as possible. Accordingly, if H is fallen off from ammonia, H is combined with the $NH_2$ radical and thus becomes $NH_3$.

$$(CH_3)_2N-NH_2 \rightarrow (CH_3)_2N + NH_2$$

Thermal decomposition

$$NH_2 \rightarrow NH_3$$

Hydrogen radical combination

Furthermore, the $(CH_3)_2N$ radical that is formed through the first thermal decomposition of hydrazine forms an N radical and a $CH_3$ radical through secondary thermal decomposition. At this time, the $CH_3$ radical is also thermally unstable and tries to become $CH_4$ through combination with nearby hydrogen. Accordingly, if H is fallen off from ammonia, H is combined with the $CH_3$ radical and thus becomes $CH_4$.

$$(CH_3)_2N \rightarrow 2(CH_3) + N \rightarrow 2CH_4 + N$$

Thermal decomposition  Hydrogen radical combination

Therefore, if hydrazine is used as a nitrogen precursor for growing $Al_xGa_yIn_{1-x-y}N$:Mg together with ammonia, hydrogen radicals existing in a gas phase layer from ammonia are removed effectively by means of $NH_2$ and $CH_3$ radicals of hydrazine. It is thus possible to minimize formation of a Mg—H complex that is easily generated only when ammonia is used. Since all hydrazine sources essentially contain $NH_2$ radicals, hydrogen radicals can be thus removed at the gas phase in a reactor. Since the hydrogen radicals provided from ammonia can be removed through hydrazine as such, there is eliminated the need for an additional subsequent annealing process for breaking a Mg—H bond as in the prior art. A more detailed example for forming p-type GaN will now be described on the basis of the above theoretical background.

Dimethylhydrazine (DMHy) is used as a hydrazine source, trimethylgallium (TMGa) is used as a gallium source and $Cp_2Mg$ is used as a Mg source. A mixture of hydrazine and ammonia are used as an nitrogen precursor.

In the amount of hydrazine that is used when a p-type GaN thin film is grown, it is preferred that the molar flow ratio of hydrazine/gallium is 1 to 1000, more preferably 1 to 500. In the amount of ammonia mixed at this time, an ammonia/gallium molar flow ratio is below 10000, more preferably below 5000.

When a p-type $Al_xGa_yIn_{1-x-y}N$ thin film is formed using hydrazine, nitrogen ($N_2$) or hydrogen ($H_2$) is used as a carrier gas. It may be preferred that a nitrogen radical is mainly used in order to prohibit formation of a hydrogen radical. If hydrogen is mixed with nitrogen, a higher hole concentration can be obtained. This is because hydrogen serves to reduce the background doping concentration when GaN is grown. It is preferred that 0% to 100% of hydrogen is mixed with the nitrogen carrier gas as a preferred carrier gas, more preferably 0% to 80% of hydrogen is mixed with the nitrogen carrier gas.

TEST EXAMPLE

In a prior art in which a p-GaN layer is formed using ammonia, a hole measurement was impossible since the p-GaN layer has the properties of an insulator due to Mg—H bond. Thus, after the p-GaN layer had been converted into a p-type layer by removing hydrogen radicals from the p-GaN layer through subsequent annealing at high temperature, hole measurement was implemented. On the contrary, in the present invention in which a p-type GaN layer is formed using hydrazine, a hole measurement can be performed without any subsequent annealing. In case of the present invention, it has been demonstrated that the GaN layer becomes the p-type layer even without performing the annealing process since it has a hole concentration of $2\sim13\times10^{17}$ [/cm$^3$] and a hole mobility of $10\sim50$ [cm$^2$/Vs].

A dispute over conversion into the p-type layer due to alloy annealing was excluded by performing a hole measurement without performing alloy annealing of the p-type contact metal.

Moreover, as a result of measuring sheet resistance, it has been found that the present invention in which subsequent annealing is not performed after the p-type GaN layer has been formed using hydrazine, has a sheet resistance value 2 to 3 times lower than the prior art in which subsequent annealing is implemented after the p-type GaN layer has been formed using ammonia. This measurement result shows an important ground data that supports that a p-type $Al_xGa_yIn_{1-x-y}N$:Mg thin film can be produced even without subsequent annealing if hydrazine is employed.

Table 1 shows electrical properties between a conventional LED in which a transparent electrode layer is formed after a p-type GaN layer has been formed using ammonia and been annealed for activation at a high temperature, and a LED according to the present invention in which a transparent electrode layer is formed after a p-type GaN layer has been formed using hydrazine without carrying out subsequent annealing.

TABLE 1

|   | p-GaN using NH$_3$ (a transparent electrode is formed after activation annealing) | p-GaN using hydrazine (a transparent electrode is formed without activation annealing) |
| --- | --- | --- |
| Operating Voltage (20 mA) | 3.15 V | 3.15 V |
| Reverse Breakdown Voltage (−10 μA) | 20 V | 26.7 V |
| Output Power(20 mA) | 12 mW | 13.5 mW |

As can be seen from Table 1, the present invention has a good operating voltage which is 3.15V at 20 mA. In case of the output power, the prior art has an output power of 12 mW (self-measurement reference). On the contrary, the present invention has an output power of 13.5 mW, which is over 10% higher than that of the prior art. From this result, it can be seen that the quality of the active layer can be improved by omitting a hydrogen-eliminating process through annealing process. Also, the present invention has a more increased reverse breakdown voltage of about 26V as compared with 20V of the prior art.

Figure 3:
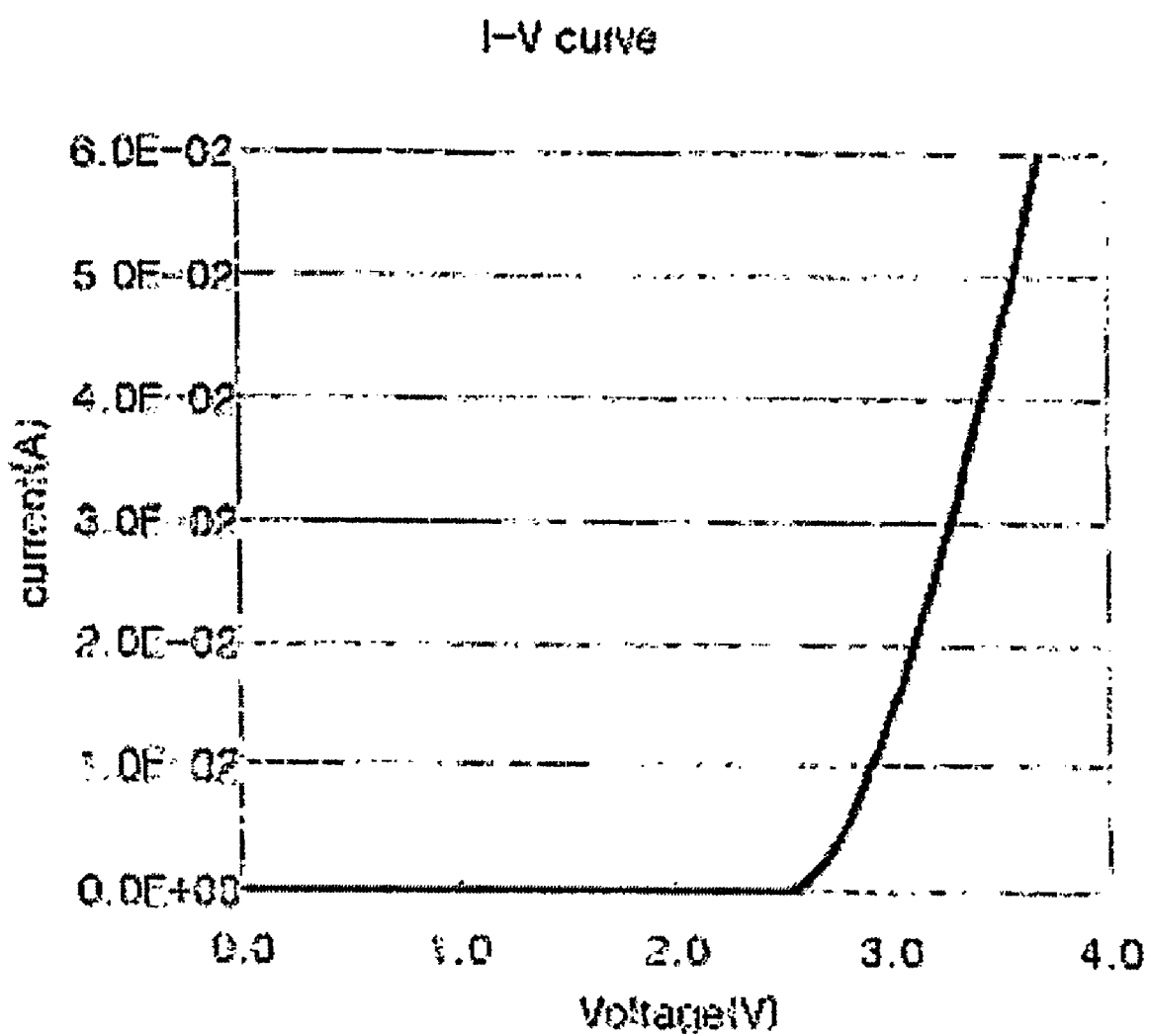
FIG. 3 shows a current-voltage characteristic curve of the nitride semiconductor light emitting device according to the present invention.

FIG. 3 shows a current-voltage characteristic curve of the nitride semiconductor light emitting device according to the present invention. From FIG. 3, it can be seen that the property of a semiconductor is exhibited properly even without performing subsequent annealing.

Figure 4:
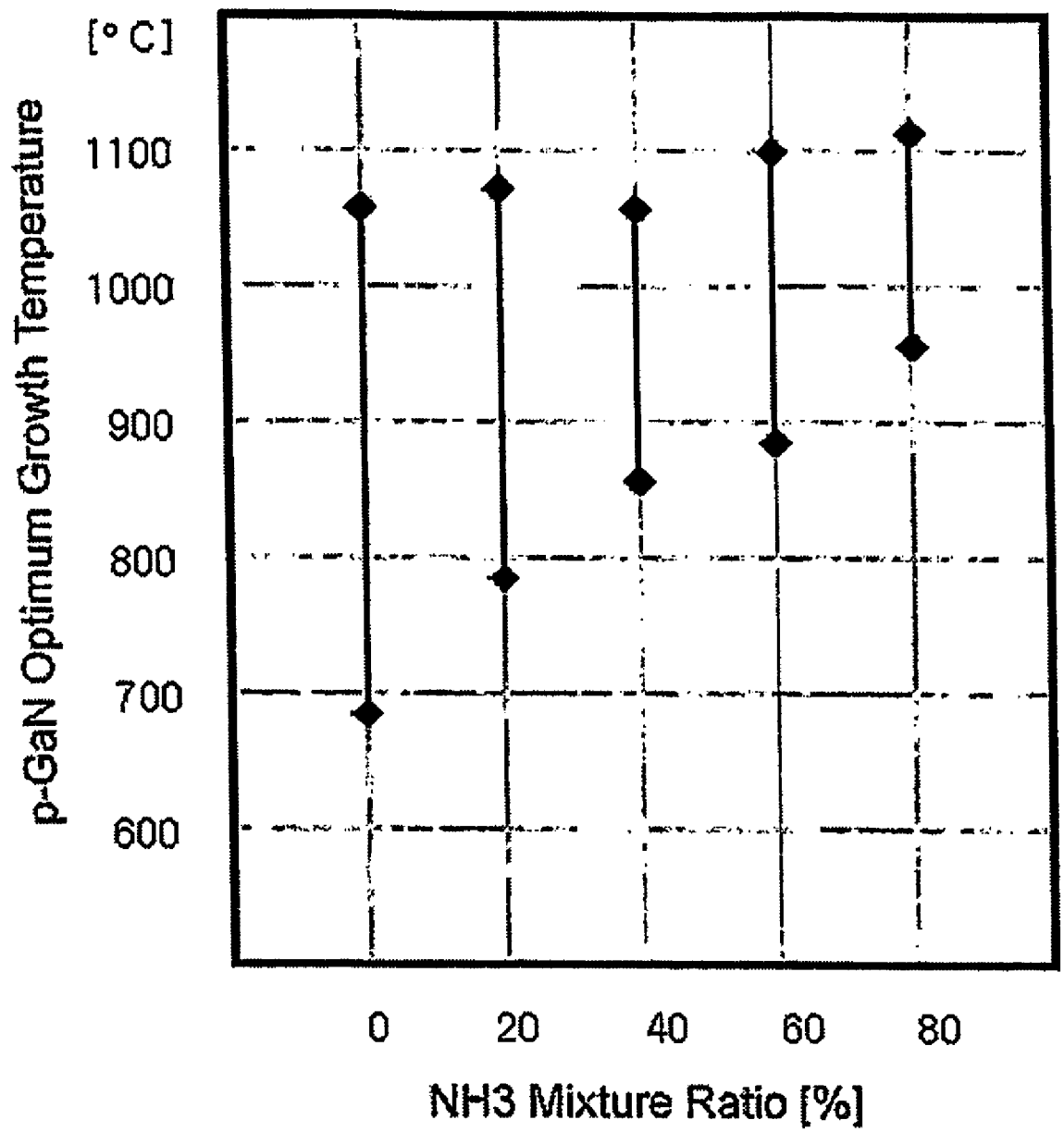
FIG. 4 is a graph showing the relationship between the mixture ratio of $NH_3$ and an optimum growth temperature of p-type GaN.

FIG. 4 is a graph showing the relationship between the mixture ratio of NH$_3$ and an optimum growth temperature of p-type GaN. FIG. 4 shows a result in which an experiment is performed in a mixture ratio ranging from 0% to 80% of NH$_3$. In FIG. 4, the mixture ratio of NH$_3$ is defined as percentage (%) of the molar flow ratio of NH$_3$ for the molar flow rate of the whole V group precursor, assuming that NH$_3$ is 1% and hydrazine is 100% at a temperature below 1000° C. in terms of cracking efficiency. When the optimum growth temperature is defined based on $1\times10^{17}$/cm$^3$ as a lower limit value, it can be seen that the optimum growth temperature rises as the mixture ratio of NH$_3$ increases. That is, although a mixture source of a hydrazine-based source and a NH$_3$ gas is used as a V group precursor, p-type $Al_xGa_yIn_{1-x-y}N$:Mg can be obtained at a sufficiently low temperature.

INDUSTRIAL APPLICABILITY

While the present invention has been described, focusing on a light emitting device such as a laser diode and a light emitting diode, it may be applied to a light receiving element such as a photodiode.

The invention claimed is:

1. A method of manufacturing a nitride semiconductor light emitting device, the nitride semiconductor light emitting device including a plurality of nitride semiconductor layers and an electrode layer disposed on the plurality of the nitride semiconductor layers, the plurality of nitride semiconductor layers having an active layer that generates light through recombination of electrons and holes, and a p-type nitride semiconductor layer for supplying holes to the active layer, the method comprising the steps of:

forming the p-type nitride semiconductor layer of the plurality of nitride semiconductor layers, without a subsequent annealing process, by using ammonia and hydrazine-based material as nitrogen precursor wherein the p-type nitride semiconductor layer contains gallium, and the molar flow ratio of hydrazine-based material/gallium in 1 to 10 and, upon thermal decomposition, the hydrazine-based material generates a radical that is combined with a hydrogen radical to eliminate the hydrogen radical to make the p-type nitride semiconductor layer without the subsequent annealing process during the formation of the p-type nitride semiconductor layer; and forming the electrode layer to be electrically in contact with the p-type nitride semiconductor layer.

2. The method of claim 1, wherein the electrode layer is made of at least one selected from the group consisting of nickel, gold, silver, chrome, titanium, platinum, palladium, rhodium, iridium, aluminum, tin, ITO, indium, tantalum, copper, cobalt, iron, ruthenium, zirconium, tungsten, lanthanum and molybdenum.

3. The method of claim 2, wherein the molar flow ratio of hydrazine-based material/gallium is 1 to 500.

4. The method of claim 3, wherein the electrode layer is made of ITO (Indium Tin Oxide).

5. The method of claim 3, wherein the p-type nitride semiconductor layer is doped with magnesium (Mg) and the p-type nitride semiconductor layer is made of GaN.

6. The method of claim 5, wherein the molar flow ratio of ammonia/gallium is below 5000, and $N_2$ and $H_2$ are used as carrier gas.

7. The method of claim 6, wherein a radical of the hydrazine-based material contains at least one of $CH_3$ and $NH_2$.

* * * * *